United States Patent
Krishnan et al.

(10) Patent No.: US 6,399,452 B1
(45) Date of Patent: Jun. 4, 2002

(54) METHOD OF FABRICATING TRANSISTORS WITH LOW THERMAL BUDGET

(75) Inventors: Srinath Krishnan, Campbell; Witold Maszara, Morgan Hill, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/612,200

(22) Filed: Jul. 8, 2000

(51) Int. Cl.[7] ............................................. H01L 21/336
(52) U.S. Cl. ........................ 438/305; 438/301; 438/303; 438/306; 438/307; 438/361; 438/366; 438/286; 438/344; 438/396; 438/592
(58) Field of Search ................................. 438/396, 305, 438/361, 366, 286, 303, 592, 344, 301, 306, 307

(56) References Cited

U.S. PATENT DOCUMENTS 6,008,099 A * 12/1999 Sultan et al. ............... 438/305
6,091,118 A * 7/2000 Duane ........................ 257/386
6,191,463 B1 * 2/2001 Mitani et al. ............... 257/411
6,235,599 B1 * 5/2001 Yu ............................. 438/305

FOREIGN PATENT DOCUMENTS

JP             361078 A2 *  4/1990  .................. 438/586

* cited by examiner

Primary Examiner—Caridad Everhart
Assistant Examiner—V. Yevsikov
(74) Attorney, Agent, or Firm—Skjerven Morrill MacPherson LLP

(57) ABSTRACT

A low thermal budget transistor is fabricated by first forming a gate on a semiconductor substrate. First amorphous regions and first inactive dopant regions are then created in the substrate by ion implantation. Sidewall spacers, which align subsequent implantation steps, are formed adjacent to the gate. Thereafter, second amorphous regions and second inactive dopant regions are created in the substrate by ion implantation. Dopants in the first and second inactive dopant regions are then activated using a low temperature annealing process to create source/drain regions and source/drain extension regions. The aforementioned process simplifies the fabrication of a low thermal budget transistor by dispensing with the requirement to remove the sidewall spacers.

11 Claims, 6 Drawing Sheets

METHOD OF FABRICATING TRANSISTORS WITH LOW THERMAL BUDGET

BACKGROUND OF THE INVENTION

1. Field of the Invention

The present invention generally relates to semiconductor device fabrication and more specifically to the fabrication of transistors with low thermal budget.

2. Description of the Related Art

Transistors are widely used in electronic circuits. A typical metal oxide semiconductor (MOS) transistor, for example, has a gate, a source, and a drain that are formed in a semiconductor substrate. FIGS. 1A–1E illustrate the basic process sequence for fabricating a p-channel MOS transistor in accordance with a method in the prior art. In this example, an n-type dopant such as phosphorous or arsenic is implanted in substrate 101 to provide background doping. A gate electrode 103 (e.g., polysilicon) is formed on top of a gate dielectric 102 (FIG. 1A), which is formed on top of substrate 101. Using gate electrode 103 for alignment, a p-type dopant such as boron or indium is implanted in substrate 101 to create inactive dopant regions 104 (FIG. 1B). Sidewall spacers 105 (e.g., silicon nitride) are formed adjacent to gate electrode 103 and on top of inactive dopant regions 104 (FIG. 1C) for aligning the implantation of a p-type dopant in substrate 101 and thereby create inactive dopant regions 106 (FIG. 1D). Subsequently, source/drain extension ("SDE") regions 107 and source/drain ("SD") regions 108 are created (FIG. 1E) by activating inactive dopant regions 104 and 106 by high temperature (e.g., 700° C. to 1100° C.) rapid thermal annealing. An n-channel MOS transistor can be similarly fabricated using appropriate dopants.

An MOS transistor can also be fabricated using the so-called disposable spacer process illustrated in FIGS. 2A–2C. In FIG. 2A, sidewall spacers 205 are formed adjacent to a gate electrode 203, which overlies a gate dielectric 202. Using sidewall spacers 205 for alignment, a p-type dopant is implanted in a substrate 201 to create inactive dopant regions 206. Sidewall spacers 205 are removed and, subsequently, inactive dopant regions 207 are created by implanting a p-type dopant in substrate 201 using gate electrode 203 for alignment (FIG. 2B). SDE regions 209 and SD regions 208 are created by activating inactive dopant regions 207 and 206, respectively. While the disposable spacer process has known advantages, the added complexity of having to remove sidewall spacers 205 is not desirable in some applications.

The amount of heat which a semiconductor device absorbs during fabrication is referred to as "thermal budget." A transistor with a low thermal budget is advantageous because high temperature processing can cause transient enhanced diffusion ("TED"), which degrades the device's characteristics.

From the foregoing, it is desirable to have a method for fabricating an MOS transistor with a low thermal budget and without the need to dispose sidewall spacers.

SUMMARY OF THE INVENTION

The invention relates to the fabrication of a transistor with a low thermal budget.

In one embodiment, a transistor is fabricated by forming a gate on a semiconductor substrate. A first amorphous region is created by implanting heavy ions in the substrate using the gate for alignment. Dopants are then implanted in the substrate to create a first inactive dopant region. Sidewall spacers, which align subsequent implantation steps, are formed adjacent to the gate. Thereafter, a second amorphous region is created by implanting heavy ions in the substrate. Dopants are implanted in the substrate to create a second inactive dopant region. Dopants in the first and second inactive dopant regions are then activated using a relatively low temperature annealing process to create source/drain and source/drain extension regions. The present invention simplifies the fabrication of a low thermal budget transistor by dispensing with the requirement to remove the sidewall spacers.

BRIEF DESCRIPTION OF THE DRAWINGS

The use of the same reference numeral in different figures indicates the same or like elements. The figures in this disclosure are schematic representations and not drawn to scale.

DETAILED DESCRIPTION

FIGS. 3A–3H show cross-sectional views of a transistor being fabricated in accordance with an embodiment of the present invention. Processing steps that are well known and not necessary to the understanding of the invention are not shown in the interest of clarity. While a p-channel MOS transistor is described as an example, the invention is not so limited and can also be used in the fabrication of other transistors such as n-channel MOS transistors.

Figure 1A:
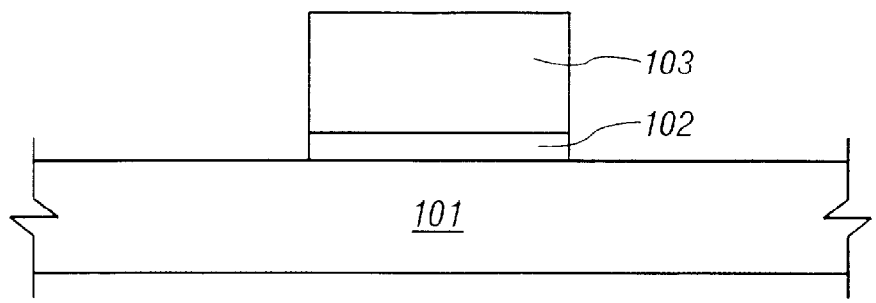
FIGS. 1A–1E show cross sectional views of a transistor being fabricated in accordance with a method in the prior art.
Figure 1B:
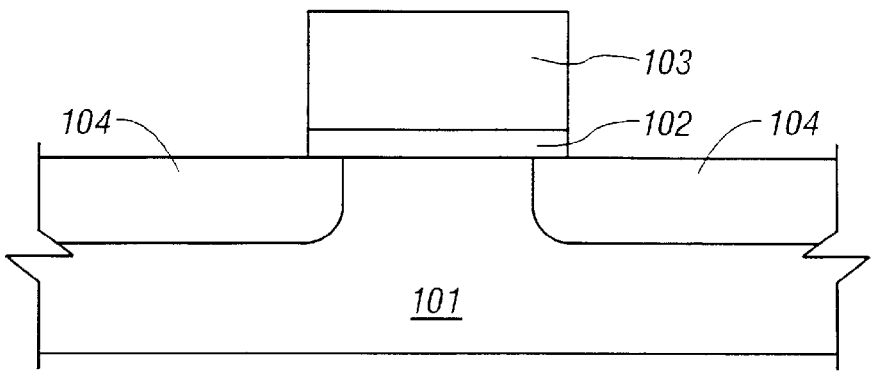
Figure 1C:
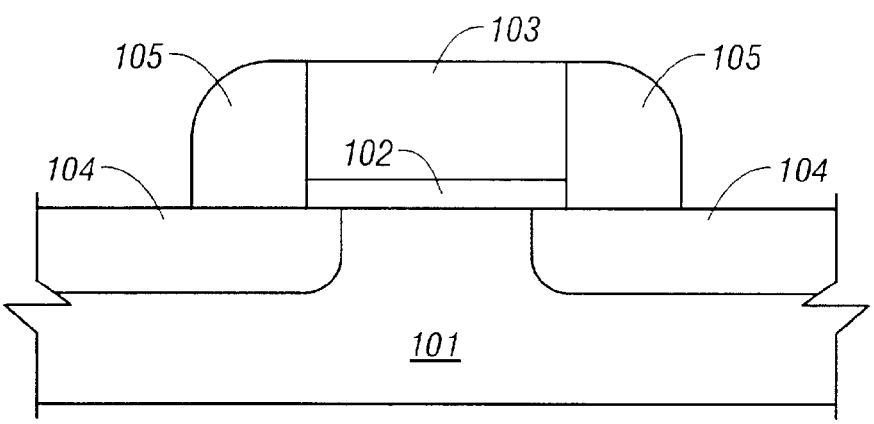
Figure 1D:
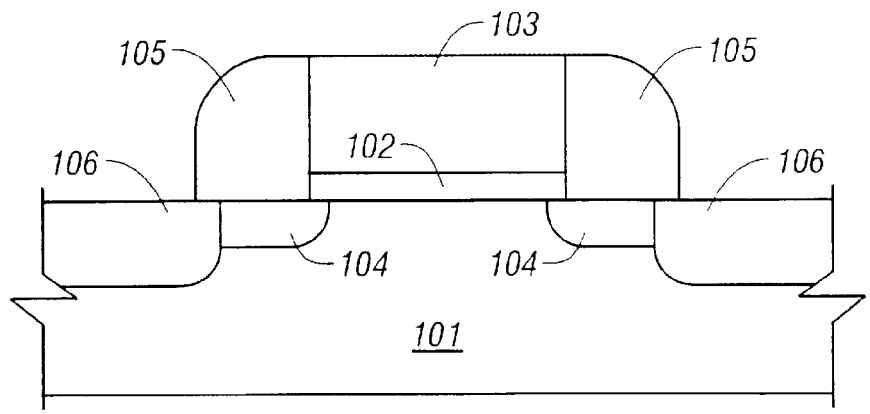
Figure 1E:
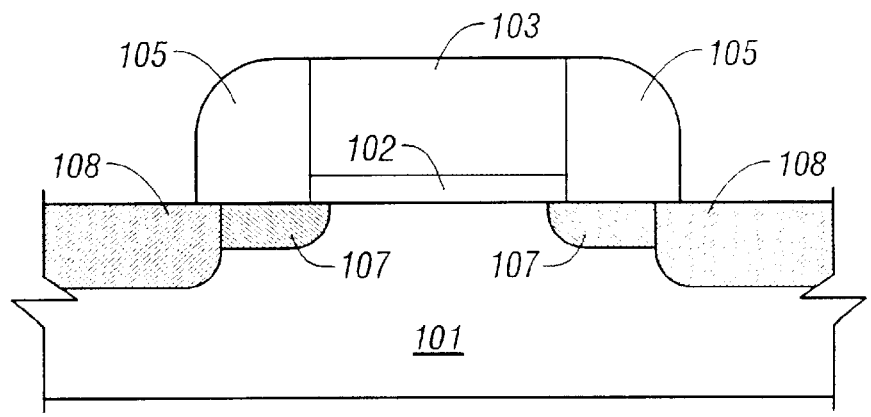
Figure 2A:
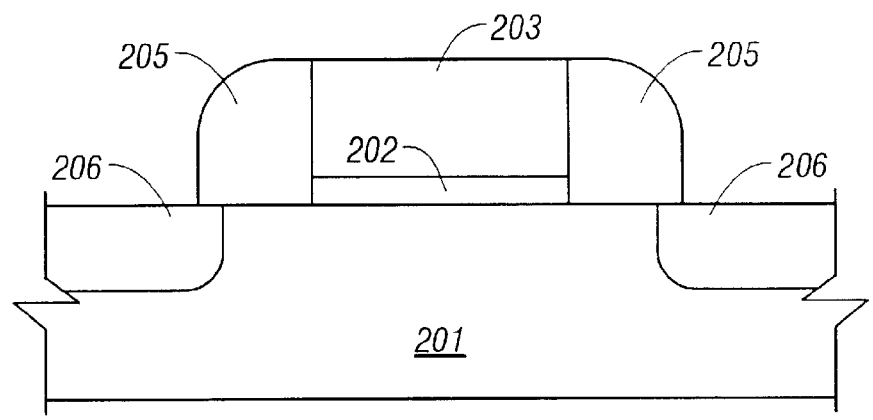
FIGS. 2A–2C show cross sectional views of a transistor being fabricated in accordance with another method in the prior art.
Figure 2B:
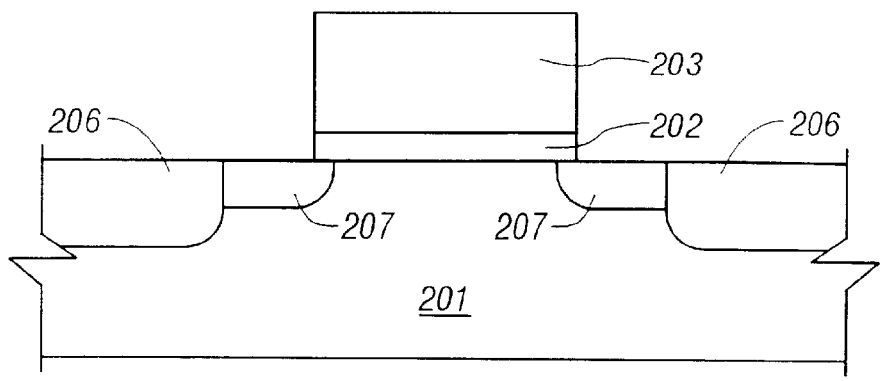
Figure 2C:
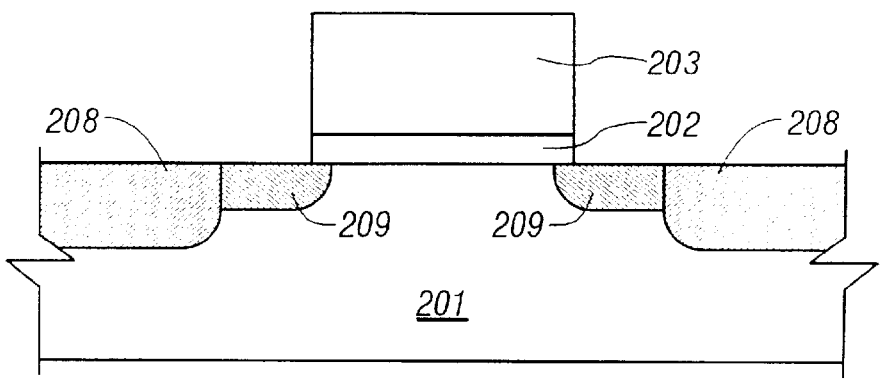
Figure 3A:
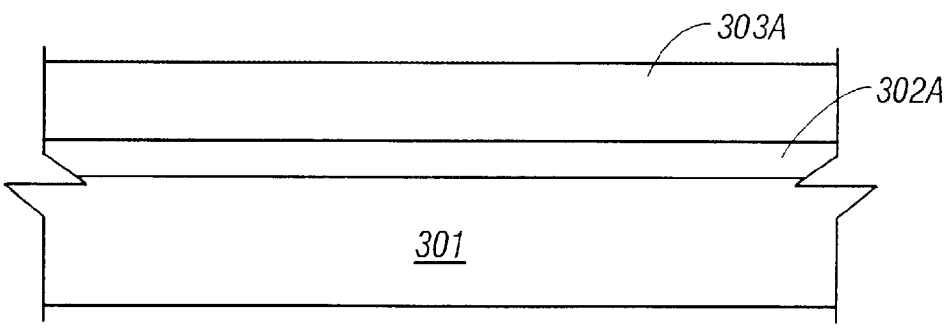
FIGS. 3A–3H show cross sectional views of a transistor being fabricated in accordance with a method in one embodiment of the invention.
Figure 3B:
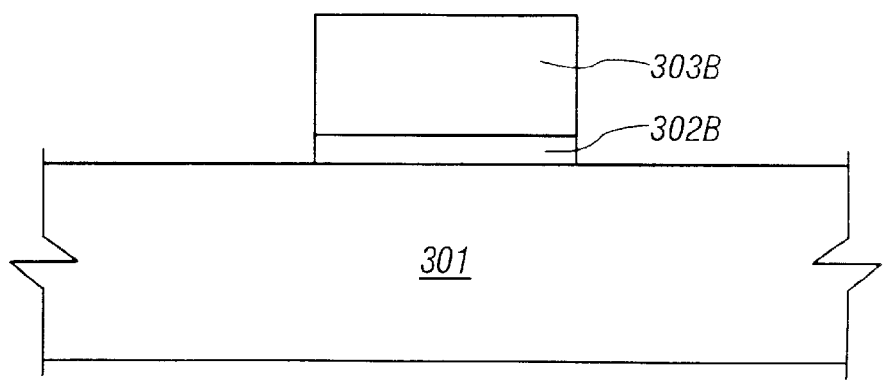

Referring to FIG. 3A, a semiconductor substrate 301 is implanted with an n-type dopant (e.g., phosphorous, arsenic) to set the threshold voltage of the p-channel MOS transistor being fabricated. Setting the threshold voltage of an MOS transistor by ion implantation is well known. Thereafter, a dielectric layer 302A, which is of silicon dioxide in this embodiment, is thermally grown on substrate 301. Other dielectric materials such as silicon nitride can also be used as a dielectric layer. A gate electrode layer 303A (e.g., polysilicon) is deposited on top of dielectric layer 302A. An n-type dopant is then, implanted in gate electrode layer 303A as a pre-doping step to minimize gate depletion. The dopant implanted in gate electrode layer 303A is activated by high temperature annealing (e.g., 1000° C. for 20 seconds). Gate electrode layer 303A and dielectric layer 302A are patterned using conventional lithography techniques to form gate electrode 303B and gate dielectric 302B, respectively (FIG. 3B).

Figure 3C:
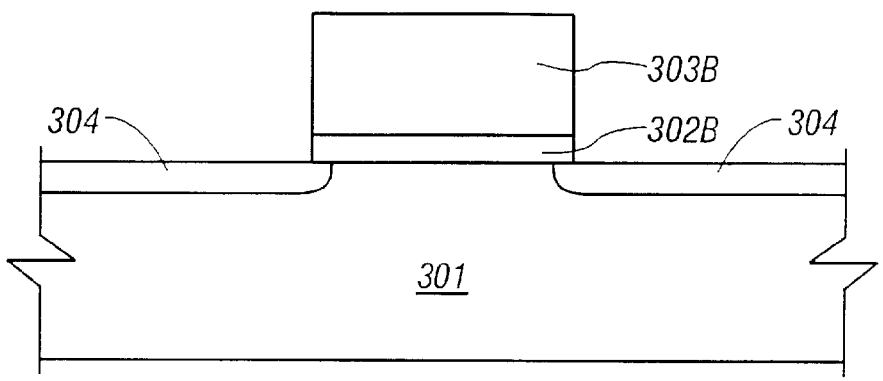
Figure 3D:
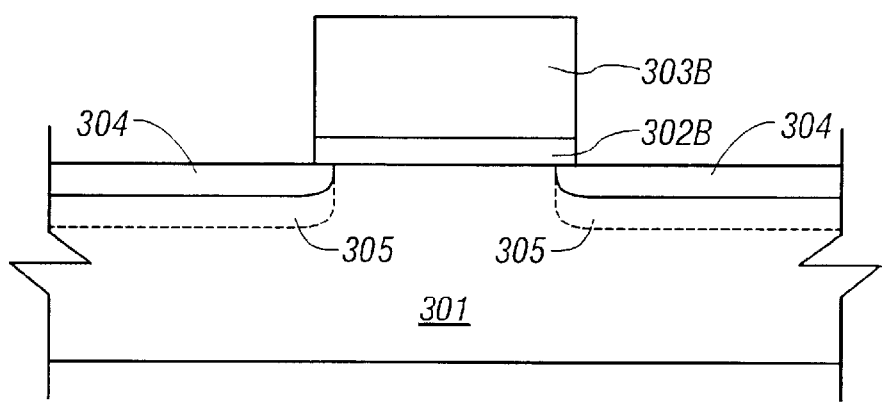

After gate electrode 303B and gate dielectric 302B are formed, amorphous regions 304 are created by implanting heavy ions, such as silicon or germanium ions, in substrate 301 (FIG. 3C). In one embodiment, germanium ions at a dose of $5 \times 10^{14}/cm^2$ are implanted in substrate 301 at an energy of 20 keV (i.e. 20 kilo electron-Volts) to create amorphous regions 304 that are 250 to 270 Å deep. A p-type dopant (e.g., boron, indium) is then implanted in substrate 301 to create inactive dopant regions 305 (FIG. 3D). In one embodiment, inactive dopant regions 305 that are 300 Å deep are created by implanting boron in substrate 301 at a dose of $1\times10^5/cm^2$ and energy of 3 to 5 keV. As explained further below, amorphous regions 304 set the depth of source/drain extension ("SDE") regions that will be created later on in the process. Thus, inactive dopant regions 305 can be made deeper than amorphous regions 304.

Figure 3E:
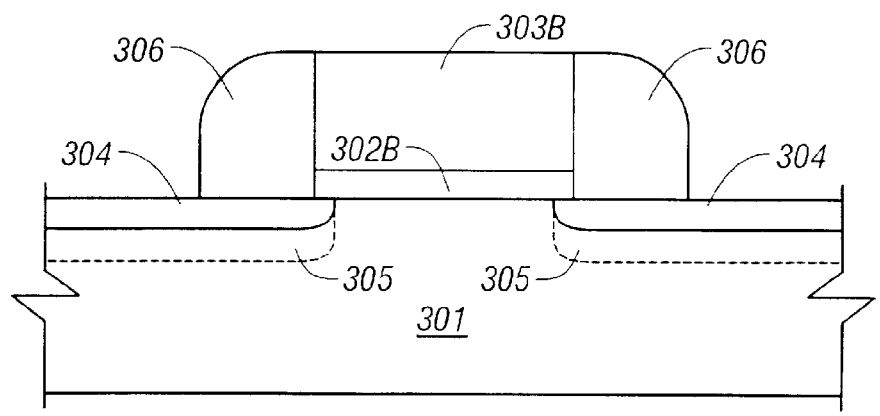
Figure 3F:
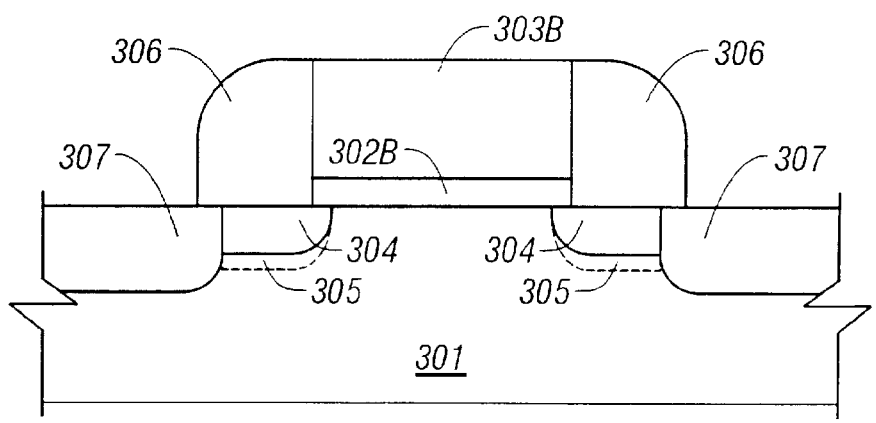
Figure 3G:
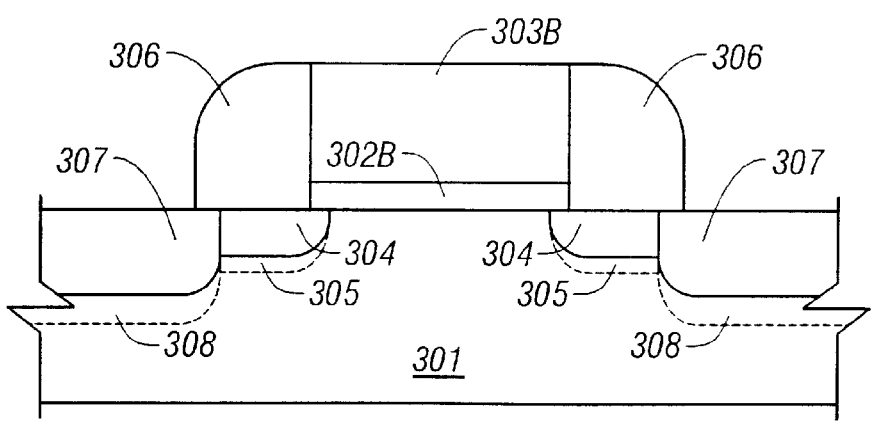

Sidewall spacers 306, which can be of silicon nitride or silicon dioxide, are formed after the creation of inactive dopant regions 305 (FIG. 3E). Amorphous regions 307 are created by implanting heavy ions in substrate 301 using sidewall spacers 306 for alignment (FIG. 3F). In one embodiment, germanium ions at a dose of $5\times10^{14}/cm^2$ are implanted in substrate 301 at an energy of 40 keV to create amorphous regions 307 that are 550 Å deep. Inactive dopant regions 308 are created by implanting a p-type dopant in substrate 301 (FIG. 3G). As an example, inactive dopant regions 308 that are 600 Å deep can be created by implanting boron in substrate 301 at a dose of $1\times10^{15}/cm^2$ and energy of 6 to 8 keV. Amorphous regions 307 set the depth of source/drain ("SD") regions that will be created later on in the process. Thus, inactive dopant regions 308 can be made deeper than amorphous regions 307.

Figure 3H:
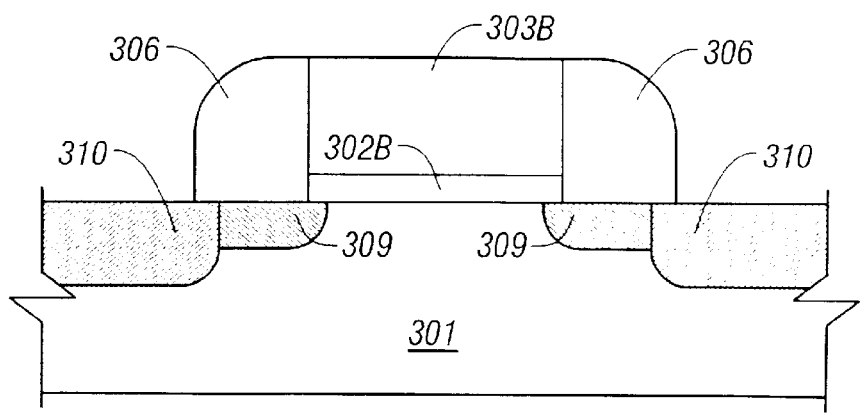

Inactive dopant regions 305 and 308 are activated by a low temperature annealing process to create SDE regions 309 and SD regions 310 (FIG. 3H). The low temperature anneal is performed at a temperature that is high enough to recrystallize amorphous regions 304 and 307 through the solid phase epitaxial growth of substrate 301, but low enough to prevent activation of portions of inactive dopant regions 305 and 308 that are outside the amorphous regions. Thus, only p-type dopants within the amorphous regions are activated, resulting in SDE regions 309 and SD regions 310 that are about as deep as amorphous regions 304 and 307, respectively. In one embodiment, SDE regions 309 and SD regions 310 are created by a low temperature annealing process at a temperature of 600° C. for 100 seconds. Thereafter, a conventional silicide process is performed. A low temperature silicide process, such as a nickel silicide process, with a temperature lower than that employed in the low temperature anneal is preferable to prevent dopant deactivation. SDE regions 309 and SD regions 310 can also be created using the method described in commonly-assigned U.S. Patent Application, "Formation Of Low Thermal Budget Shallow Abrupt Junctions For Semiconductor Devices," application Ser. No. 09/226,773, filed on Jan. 6, 1999, incorporated herein by reference in its entirety.

The present invention uses a low temperature process to activate SD and SDE regions, thereby resulting in a transistor with a low thermal budget. Further, the invention simplifies the fabrication of a low thermal budget transistor by dispensing with the requirement to remove sidewall spacers.

Figure 4A:
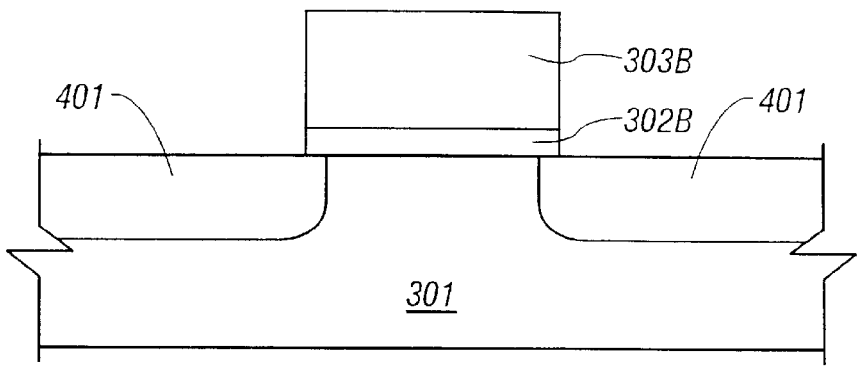
FIGS. 4A–4B show cross sectional views of a transistor being fabricated in accordance with a method n another embodiment of the invention.
Figure 4B:
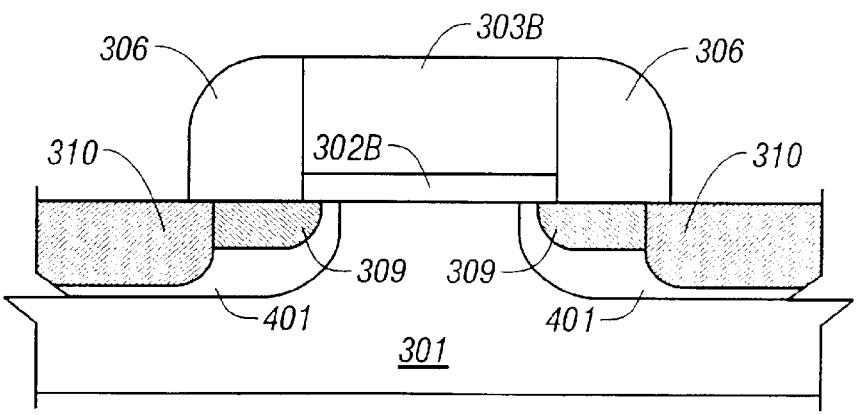

Optionally, halo implant regions can be created in substrate 301 to prevent what is commonly known as short channel effects ("SCE"). In one embodiment, arsenic, an n-type dopant, is implanted in substrate 301 at a dose of $1\times10^{13}/cm^2$ to $5\times10^{13}/cm^2$ and energy of 50 to 70 keV to create halo implant regions 401 after gate electrode 303B and gate dielectric 302B are formed (FIG. 4A). After halo implant regions 401 are activated by annealing (e.g., 950° C. for 10 seconds), SDE regions 309 and SD regions 310 are created as illustrated in FIGS. 3C–3H and accompanying description. In this specific embodiment, halo implant regions 401 are created such that they encompass SDE regions 309 and SD regions 310 (FIG. 4B).

The description of the invention given above is provided for purposes of illustration and is not intended to be limiting. Numerous variations are possible within the scope of the invention. The invention is set forth in the following claims.

What is claimed is:

1. A method for fabricating a semiconductor device comprising the acts of:

forming a gate dielectric overlying a semiconductor substrate;

forming a gate electrode overlying said gate dielectric;

creating a first amorphous region in said substrate;

creating a first inactive dopant region in said substrate;

forming a sidewall spacer adjacent to said gate electrode and overlying said first amorphous region;

creating a second amorphous region in said substrate;

creating a second inactive dopant region in said substrate; and activating dopants in said first and second amorphous regions.

2. The method of claim 1 wherein said semiconductor device includes a transistor.

3. The method of claim 1 wherein said first amorphous region and said second amorphous region are created by implanting heavy ions in said substrate.

4. The method of claim 1 wherein the act of activating dopants in said first and second amorphous regions is by thermal annealing at a temperature less than or equal to about 600° C.

5. A process for fabricating a transistor comprising:

forming a gate on a substrate;

creating a first amorphous region by implanting heavy ions in said substrate;

creating a first inactive dopant region by implanting dopants in said substrate;

forming a sidewall spacer adjacent to said gate;

creating a second amorphous region by implanting heavy ions in said substrate;

creating a second inactive dopant region by implanting dopants in said substrate; and activating dopants within said first amorphous region and said second amorphous region.

6. The process of claim 5 wherein said transistor is a metal oxide semiconductor (MOS) transistor.

7. The process of claim 5 wherein said heavy ions are chosen from a group consisting of germanium and silicon ions.

8. The process of claim 5 wherein said gate comprises:

a gate dielectric in contact with said substrate; and a gate electrode overlying said gate dielectric.

9. The process of claim 5 wherein the act of activating dopants within said first amorphous region and said second amorphous region is by an annealing process at a temperature less than or equal to about 600° C.

10. The process of claim 9 wherein the act of activating dopants within said first amorphous region creates a source/drain extension region that is approximately as deep as said first amorphous region.

11. The process of claim 10 wherein the act of activating dopants within said second amorphous region creates a source/drain region that is approximately as deep as said second amorphous region.

* * * * *